United States Patent [19]
Morikawa et al.

[11] Patent Number: 5,677,109
[45] Date of Patent: Oct. 14, 1997

[54] METHOD FOR E-BEAM WRITING

[75] Inventors: Junko Morikawa; Hiroshi Nozue; Hiroshi Yamashita, all of Tokyo, Japan

[73] Assignee: NEC Corporation, Japan

[21] Appl. No.: 736,294

[22] Filed: Oct. 24, 1996

Related U.S. Application Data

[63] Continuation of Ser. No. 356,151, Dec. 15, 1994, abandoned.

[30] Foreign Application Priority Data

Dec. 17, 1993 [JP] Japan ................... 5-318620

[51] Int. Cl.$^6$ .............................................. G03F 7/38
[52] U.S. Cl. .................. 430/296; 430/330; 430/942; 250/492.2
[58] Field of Search ....................... 430/296, 311, 430/330, 942; 250/492.1, 492.2, 492.3; 156/643.1, 659.11

[56] References Cited

U.S. PATENT DOCUMENTS

| 4,348,473 | 9/1982 | Okumura | 430/296 |
| 5,106,455 | 4/1992 | Jacobsen | 156/659.1 |
| 5,127,987 | 7/1992 | Okudaira | 156/643 |

*Primary Examiner*—Kathleen Duda
*Attorney, Agent, or Firm*—Hayes, Soloway, Hennessey, Grossman & Hage, P.C.

[57] ABSTRACT

A method for writing on a semiconductor wafer using electron beams is provided. One embodiment of the method includes the steps of using electron beams to irradiate a semiconductor substrate on which a resist layer has been formed, to thereby draw patterns on the resist layer, and then baking the resist layer and substrate in a vacuum.

8 Claims, 2 Drawing Sheets

METHOD FOR E-BEAM WRITING

This is a continuation of application Ser. No. 08/356,151 filed on Dec. 15, 1994 now abandoned.

BACKGROUND OF THE INVENTION

1. Field of the Invention

The invention relates to a method for writing on a semiconductor substrate with electron beams, and more particularly to such a method for irradiating electron beams to a semiconductor substrate on which a resist is applied, to thereby form images or patterns on the resist and for stabilizing the images or patterns formed on the resist.

2. Description of the Related Art

FIG. 1 illustrates a conventional system used in a method for directly writing on a wafer with electron beams. The system comprises an electron gun 1 which generates an electron beam, an irradiation lens 2 and a shaping lens 3 for focusing the electron beam into a spot, a reduction lens 4 for reducing the size of the electron beam's spot, a projection lens 5 for projecting images to a wafer 9 with the size-reduced electron beam, a stage 11 on which a wafer 9 is to be placed, a chamber 6 in which the stage 11 is placed, a magazine 8 for storing a plurality of wafers 9 therein, and a sub-chamber 7 communicating with the chamber 6 through a gate valve 10 and accommodating the magazine 8 therein.

Images or patterns are drawn on the wafer 9 by the above mentioned system as follows. First, the magazine 8 storing a plurality of wafers 9 therein is set in the sub-chamber 7. Then, the sub-chamber 7 is evacuated. When the degree of vacuum in the sub-chamber 7 reaches approximately the same degree of vacuum in the chamber 6, the gate valve 10, which permits the sub-chamber 7 to communicate with the chamber 6, is opened to transfer the wafer 9 from the magazine 8 to the chamber 6. After the wafer 9 has been transferred, the gate valve 10 is closed.

After the wafer 9 has been set on the stage 11, electron beam irradiates to the wafer 9 to thereby draw patterns on the wafer 9. Then, the gate valve 10 is opened again to transfer the drawn wafer 9 from the chamber 6 to the sub-chamber 7 and further to the original position of the wafer 9 in the magazine 8. Then, the magazine 8 is made to move downwardly, and subsequently a second wafer 9 is transferred from the sub-chamber 7 to the chamber 6. After the gate valve 10 has been closed, patterns are drawn on the second wafer 9 in the same fashion as the first wafer. The above mentioned steps are repeated to thereby draw patterns on all wafers 9 stored in the magazine 8. After patterns have been drawn on the all wafers 9, $N_2$ gas is introduced into the sub-chamber 7 to thereby return the sub-chamber 7 to atmospheric pressure. Then, the magazine 8 is taken out of the sub-chamber 7, and the wafers 9 are taken out of the magazine 8. Then, the wafers 9 are baked one by one in a baking unit of a developing apparatus for stabilizing patterns drawn on the wafers 9. Then, the patterns are developed.

As having been aforementioned, in a conventional system used in a method for drawing patterns on a wafer, it is required that a wafer stored in a magazine is taken out one by one, and then is drawn thereon, and then is baked one by one in a baking furnace of a developing apparatus. On a wafer is applied a resist layer including an acid generator. The acid generator is quite unstable, and hence, if a drawn wafer is placed in an atmosphere for relatively a long time, the performance of a resist such as sensitivity and resolution is badly affected. Specifically, the width of lines in the patterned resist cannot be maintained to be uniform. For instance, comparing to a line width of pattered resist which has been baked immediately after drawing, there is a dimensional dispersion of approximately 10% in the line width of images which have been baked 30 minutes after drawing, and there is a dimensional dispersion of approximately 50% in the line width of resist pattern which has been baked about 5 to 6 hours after drawing. In addition, the baking of a drawn wafer is carried out in an atmosphere, and accordingly dust or debris may attach to the wafer, or resist applied on the wafer may be oxidized. Such accumulation of dust and/or oxidation of the resist further deteriorate uniformity of the line width of the resist.

SUMMARY OF THE INVENTION

It is an object of the present invention to provide a method for writing on a wafer with an electron beam, which method provides images or patterns having no dispersion in the line width of resist.

The invention provides a method for direct writing on a semiconductor wafer or mask writing with electron beams, the method including the steps of using electron beams to irradiate a semiconductor substrate or mask blanks on which a resist layer is formed, to thereby draw patterns on the resist layer, and then baking the resist layer with the semiconductor substrate being located in a vacuum.

The invention also provides a method for successive direct writing or mask writing on a semiconductor wafer or mask blanks with electron beams, the method including the steps of using electron beams in a first vacuum chamber to irridate a first semiconductor substrate or mask blanks on which a resist layer is formed, to thereby draw patterns on the resist layer, transferring the first semiconductor substrate or mask blanks to a second vacuum chamber connected with but gaseously insulated from the first vacuum chamber, transferring the first semiconductor substrate or mask blanks to a third vacuum chamber connected with but gaseously insulated from the second vacuum chamber, concurrently baking the resist layer of the first semiconductor substrate or mask blanks in the third vacuum chamber and using electron beams in the first vacuum chamber to irridiate a second semiconductor substrate or mask blanks on which a resist layer is formed, to thereby draw patterns on the resist layer of the second semiconductor substrate, taking the baked first semiconductor substrate or mask blanks out of the third vacuum chamber, and repeating the second to fifth steps a desired number of times.

In a preferred embodiment, the second vacuum chamber is maintained at the same temperature as that of the first vacuum chamber.

In another preferred embodiment, the second vacuum chamber is connected to the first vacuum chamber through a gate valve.

In still another preferred embodiment, the third vacuum chamber is connected to the second chamber through a gate valve.

The advantages obtained by the aforementioned present invention will be described hereinbelow.

As aforementioned, in accordance with the invention, a pattern-drawn wafer is baked without being exposed to an atmosphere for stabilizing the patterns. Thus, it is possible to maintain uniformity of the line width of the resist.

In addition, in accordance with the successive writing method, it is possible to successively draw patterns on wafers without exposing wafers to an atmosphere and also without, stopping the drawing process.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

A preferred embodiment in accordance with the present invention will be explained hereinbelow with reference to drawings.

Figure 1:
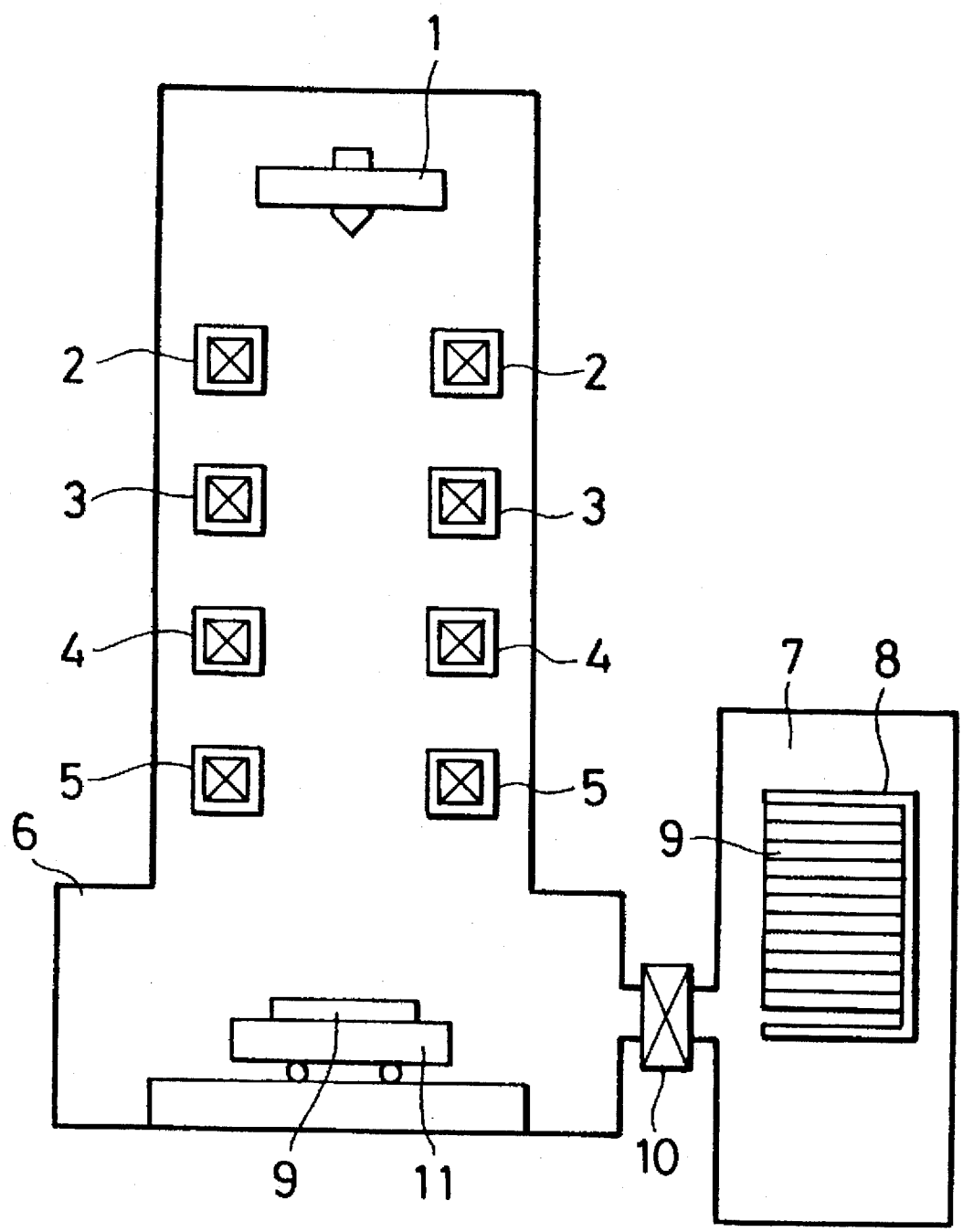
FIG. 1 is a schematic view illustrating a conventional apparatus used in a method for direct writing on a wafer with an electron beam.
Figure 2:
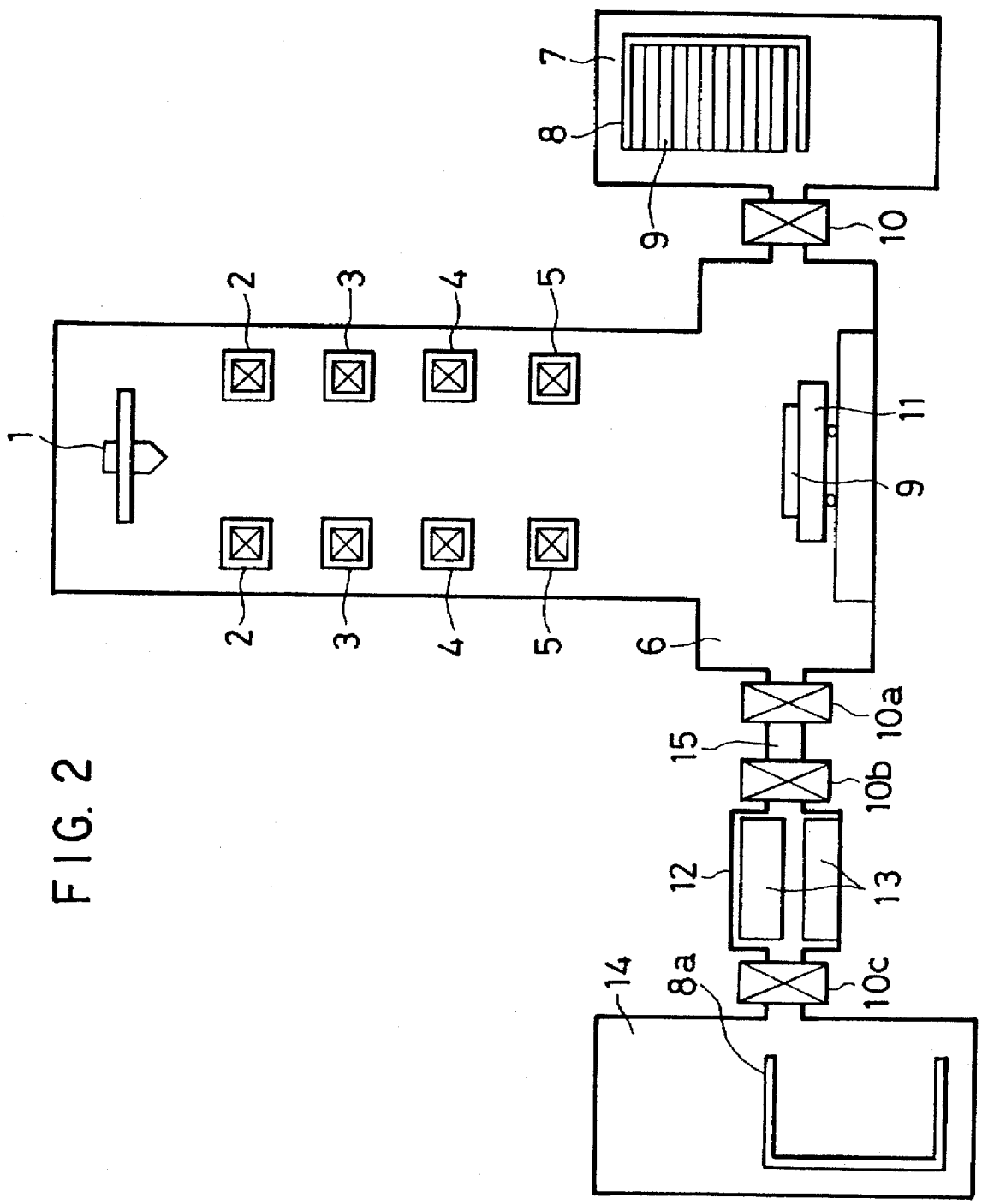
FIG. 2 is a schematic view illustrating an apparatus used in a method for direct writing on a wafer with an electron beam in accordance with an embodiment of the invention.

FIG. 2 illustrates an apparatus to be used in a method for direct writing images on a wafer with electron beams, in accordance with an embodiment of the present invention. The apparatus comprises an electron gun 1 which generates an electron beam, an irradiation lens 2 and a shaping lens 3 for focusing the electron beam into a spot, a reduction lens 4 for reducing the size of the electron beam's spot, a projection lens 5 for projecting images on a wafer 9 with the size-reduced electron beam, a stage 11 on which a wafer 9 is to be placed, a main chamber 6 in which the stage 11 is placed, a magazine 8 for storing a plurality of wafers 9 therein, and a sub-chamber 7 communicating with the chamber 6 through a gate valve 10 and accommodating the magazine 8 therein.

The apparatus further comprises a vacuum thermostatic chamber 15, a baking chamber 12 and a vacuum sub-chamber 14. The vacuum thermostatic chamber 15 is located oppositely to the sub-chamber 7 with respect to the main chamber 6, and is connected to the main chamber 6 through a gate valve 10a. The baking chamber 12 is connected to the vacuum thermostatic chamber 15 through a gate valve 10b, and contains therein a pair of hot plates 13. The vacuum sub-chamber 14 is connected with the baking chamber 12 through a gate valve 10c. In the vacuum sub-chamber 14 is placed a magazine 8a for storing image-formed and baked wafers therein.

The method in accordance with the embodiment is carried out as follows. First, the magazine 8 storing a plurality of wafers 9 therein is set in the sub-chamber 7. Then, the sub-chamber 7 is made evacuated. When the degree of vacuum in the sub-chamber 7 reaches approximately the same degree of vacuum in the main chamber 6, the gate valve 10, which permits the sub-chamber 7 to communicate with the main chamber 6, is opened to transfer one of the wafers 9 from the magazine 8 to the chamber 6. After the wafer 9 has been transferred, the gate valve 10 is closed. While the gate valve 10 is being closed, the magazine 8 is moved downwardly to a position where in a next wafer can be taken out.

After the wafer 9 has been set on the stage 11, electron beam irradiates to the wafer 9 to thereby draw patterns on the wafer 9. The gate valve 10a is opened, and then the drawn wafer 9 is transferred to the vacuum thermostatic chamber 15 which is controlled to have the same temperature as that of the main chamber 6. Then, the gate valve 10a is closed. After the gate valve 10a has been closed, the gate valve 10 is opened again to introduce a next wafer 9 into the main chamber 6 to form images on the wafer.

Concurrently with the start-up of drawing of the next wafer, the gate valve 10b is opened to permit the already drawn wafer 9 to the baking chamber 12. After the wafer 9 has been introduced into the baking chamber 12, the gate valve 10b is closed to thereby insulate the wafer 9 from the vacuum thermostatic chamber 15. The wafer 9 is baked with the hot plates 13 in the baking chamber 12. After the baking has been completed, the gate valve 10c is opened, and then the baked wafer 9 is transferred from the baking chamber 12 to the magazine 8a in the vacuum sub-chamber 14.

As aforementioned, the drawn wafer 9 is transferred from the main chamber 6 to the baking chamber 12 through the vacuum thermostatic chamber 15 which is controlled to have the same temperature as that of the main chamber 6.

In addition, the drawn wafers are transferred to the baking chamber 12 without being exposed to an atmosphere. Furthermore, immediately after the wafer has been baked in the baking chamber 12, the baked wafer is soon transferred to the vacuum sub-chamber 14. Thus, the wafer is scarcely or almost never exposed to an atmosphere. Accordingly, it is possible to completely stabilize the resist on the wafer to thereby maintain line width uniformity of the resist.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method for direct writing on a semiconductor wafer using electron beams, said method comprising the steps of:

a. irradiating with said electron beams in an evacuated space a semiconductor substrate on which a resist layer including an acid generator is formed, to thereby draw patterns on said resist layer, said patterns being for use in forming resist patterns;

b. transporting said semiconductor substrate having the patterns formed thereon to another evacuated space, said transporting taking place under vacuum conditions, said semiconductor substrate having the patterns formed thereon being unexposed to atmosphere during said transporting; and c. baking in another evacuated space said semiconductor substrate having said patterns formed thereon, wherein said baking step (c) takes place after said irradiating step (a) occurs and under sufficient conditions to form said resist patterns from said patterns, to stabilize said resist layer, and to maintain line width uniformity of said resist patterns.

2. A method for direct writing on a semiconductor wafer using electron beams, said method comprising the steps of:

a. irradiating with electron beams in a first evacuated vacuum chamber a first semiconductor substrate on which a resist layer is formed, to thereby draw patterns on said resist layer;

b. transferring said first semiconductor substrate to a second evacuated vacuum chamber connected to but gaseously insulated from said first evacuated vacuum chamber;

c. transferring said first semiconductor substrate to a third evacuated vacuum chamber connected to but gaseously insulated from said second evacuated vacuum chamber;

d. concurrently baking said resist layer of said first semiconductor substrate in said third evacuated vacuum chamber so as to stabilize said resist layer of said first substrate and so as to maintain line width uniformity of said patterns of said resist layer of said first substrate and irradiating with electron beams in said first evacuated vacuum chamber a second semiconductor substrate on which another resist layer is formed, to thereby draw patterns on the resist layer of said second semiconductor substrate;

e. taking the baked first semiconductor substrate out of said third evacuated vacuum chamber; and f. repeating steps (a)–(e) a desired number of times.

3. The method as recited in claim 2, wherein said second vacuum chamber is maintained at the same temperature as that of said first vacuum chamber.

4. The methods as recited in claim 2, wherein said second vacuum chamber is connected with said first vacuum chamber through a gate valve.

5. The method as recited in claim 4, wherein said third vacuum chamber is connected with said second chamber through a gate valve.

6. The method as recited in claim 2, wherein said resist layers of said first and second substrates each comprises an acid generator.

7. The method as recited in claim 2, wherein at least one of said resist layers of said first and second substrates comprises an acid generator.

8. A method for direct writing on a semiconductor wafer using electron beams, said method comprising the steps of:

irradiating with said electron beams in an evacuated space a semiconductor substrate on which a resist layer including an acid generator is formed, to thereby draw patterns on said resist layer for use in forming resist patterns;

transferring, under vacuum conditions and without exposing to an atmosphere said semiconductor substrate with said resist layer having said patterns to another evacuated space; and baking in said another evacuated space said semiconductor substrate with said patterns so as to form said resist patterns, stabilize said resist layer and maintain line width uniformity of said resist patterns.

* * * * *

UNITED STATES PATENT AND TRADEMARK OFFICE
CERTIFICATE OF CORRECTION

PATENT NO. : 5,677,109
DATED : October 14, 1997
INVENTOR(S) : MORIKAWA ET AL

It is certified that error appears in the above-indentified patent and that said Letters Patent is hereby corrected as shown below:

Claim 4, Col. 5, line 17, "methods" should be --method--

Signed and Sealed this

Twenty-sixth Day of May, 1998

Attest:

BRUCE LEHMAN

*Attesting Officer*     *Commissioner of Patents and Trademarks*